(12) United States Patent
Feuerbaum et al.

(10) Patent No.: US 6,730,907 B1
(45) Date of Patent: May 4, 2004

(54) CHARGED PARTICLE DEVICE

(75) Inventors: Hans-Peter Feuerbaum, Munich (DE); Dieter Winkler, Munich (DE); Dror Kella, Nes-Ziona (IL)

(73) Assignee: ICT Integrated Circuit Testing Gesellschaft für Halbleiterpruftechnik mbH, Heimsletten (DE)

( * ) Notice: Subject to any disclaimer, the term of this patent is extended or adjusted under 35 U.S.C. 154(b) by 0 days.

(21) Appl. No.: 10/031,001

(22) PCT Filed: Jun. 23, 2000

(86) PCT No.: PCT/EP00/05800
§ 371 (c)(1),
(2), (4) Date: Jul. 16, 2002

(87) PCT Pub. No.: WO01/01439
PCT Pub. Date: Jan. 4, 2001

(30) Foreign Application Priority Data

Jun. 23, 1999 (EP) ............................. 99112116

(51) Int. Cl.⁷ .................. H01J 37/244; H01J 37/28
(52) U.S. Cl. ................. 250/310; 250/307; 250/397
(58) Field of Search .............. 250/306, 307, 250/310, 397

(56) References Cited

U.S. PATENT DOCUMENTS

| | | | | |
|---|---|---|---|---|
| 3,749,926 A | * | 7/1973 | Lee | 250/305 |
| 4,587,425 A | * | 5/1986 | Plows | 250/305 |
| 4,683,376 A | * | 7/1987 | Feuerbaum | 250/309 |
| 4,849,629 A | * | 7/1989 | Daimon et al. | 250/305 |
| 5,032,724 A | * | 7/1991 | Gerlach et al. | 250/305 |
| 5,166,519 A | * | 11/1992 | Turner | 250/305 |
| 5,422,486 A | * | 6/1995 | Herrmann et al. | 250/396 R |
| 6,407,387 B1 | * | 6/2002 | Frosien et al. | 250/310 |

FOREIGN PATENT DOCUMENTS

| | | |
|---|---|---|
| DE | 42 16 730 A1 | 11/1993 |
| WO | WO 86/07188 A1 | 12/1986 |

OTHER PUBLICATIONS

Patent Abstracts of Japan, vol. 8, No. 029, (E–226) (JP 58 189950 A).

* cited by examiner

Primary Examiner—Jack Berman
(74) Attorney, Agent, or Firm—Sughrue Mion, PLLC

(57) ABSTRACT

The invention provides a charged particle device (1) comprising: a particle source (2) for providing a charged particle beam (4), and objective lens (10) for directing the particle beam onto a specimen (8), said objective lens (10) having an optical axis (6); a particle mirror (14) located on the optical axis (6) of the objective lens (10), said particle mirror having a front surface, a back surface, a drift region (26) reaching from the back surface to the front surface for letting the charged particle beam pass from the back surface to the front surface, said drift region (26) being positioned away from the optical axis (6), and a deflecting region located on the front surface for deflecting charge particles coming from the specimen towards a detector (16).

19 Claims, 6 Drawing Sheets

# CHARGED PARTICLE DEVICE

This is a National stage entry under 35 U.S.C. § 371 of PCT Application No. PCT/EP00/05800 filed Jun. 23, 2000; the above noted prior application is hereby incorporated by reference; the international application to which benefit is claimed was published under PCT Article 21(2) in English.

FIELD OF THE INVENTION

The invention relates to a charged particle device. In particular, this invention relates to a device and method for the examination of specimen with a beam of charged particles.

BACKGROUND OF THE INVENTION

Beams of negatively or positively charged particles can be used for the examination of specimen. Compared to optical light, the resolving power of a beam of charged particles is several magnitudes higher and allows for the examination of much finer details. Accordingly, charged particle beams, especially electron beams, are used in a variety of ways in biology, medicine, the materials sciences, and lithography. Examples include the diagnosis of human, animal, and plant diseases, visualisation of sub cellular components and structures such as DNA, determination of the structure of composite materials, thin films, and ceramics, or the inspection of masks and wafers used in semiconductor technology.

The two basic types of charged particle devices for the examination of specimen, that are in widespread use today, are the transmission electron microscope (TEM) and the scanning electron microscope (SEM). In addition to the normal use the two microscopes, both the TEM and SEM have been modified, resulting in instruments designed to perform specific functions. For example, the scanning transmission electron microscope (STEM) produces a transmitted image, as a TEM does, but uses a scanning beam, as the SEM does.

In conventional charged particle devices like, for example, a scanning electron microscopes (SEM) the designer always had to make a compromise between the arrangement of the objective lens for focusing the particle beam onto the specimen and the arrangement of the detector, because it is preferable to arrange both the objective lens and the detector as close as possible to the specimen in order to get the best results. However, due the fact that detectors can not be minimised beyond a certain degree, there is just not enough space for the detector in the vicinity of the specimen without negatively affecting the focusing properties of the objective lens.

Furthermore, despite their widespread use, electron microscopes are large and fairly complicated instruments, which in many universities and industrial settings have often become centralised. Electron microscope technicians have specialised training to carry out the day-to-day operations of the laboratory. However, the maintenance of the instrument and especially the adaptation of the instrument to specific measurement needs, for example by use of different spectrometers and detectors, often leads to costly downtimes of the instruments affecting a large number of users.

These problems have been partially addressed in the prior art, e.g., U.S. Pat. No. 5,422,486 which discloses a particle mirror used inside an electron microscope. However, there is a need for additional improvement.

SUMMARY OF THE INVENTION

In view of the foregoing, an object of the present invention is to provide an improved charged particle device that exhibits an improved design and that can be more easily adapted for various measurement needs. Another object of the present invention is to provide a particle mirror for use in a charged particle device. Still another object of the present invention is to provide an improved method for the examination of specimen with a beam of charged particles.

According to one aspect of the present invention, there is provided a charged particle device as specified in independent claim 1. According to a further aspect of the present invention there is provided a particle mirror for use in a charged particle device as specified in independent claim 14. According to a still further aspect of the present invention there is provided a method for the examination of specimen with a beam of charged particles as specified in independent claim 19. According to a still further aspect of the present invention there is provided a charged particle device as specified in independent claim 20. Further advantages, features, aspects and details of the invention are evident from the dependent claims, the description and the accompanying drawings. The claims are intended to be understood as a first non-limiting approach of defining the invention in general terms.

According to the first aspect of the present invention, there is provided a charged particle device comprising: a particle source for providing a charged particle beam; an objective lens for focusing the particle beam onto a specimen, said objective lens having an optical axis; a particle mirror located on the optical axis of the objective lens, said particle mirror having a front surface, a back surface, a drift region reaching from the back surface to die front surface for letting the charged particle beam pass from the back surface to the front surface, said drift region being positioned away from the optical axis, and a deflecting region located on the front surface for deflecting charged particles coming from the specimen towards a detector.

The improved charged particle device has the advantage that the use of a particle mirror results in additional freedom for the design of the charged particle device. A particle mirror, contrary to a particle detector, can be arranged in the device more easily without negatively affecting the focusing/projecting properties of the objective lens. By having the drift region, the particle mirror can be integrated in the device more easily, without negatively affecting charged particle beam. Due to the fact that the drift region is positioned away from the axis of the objective lens, the area, where the axis intersects the mirror, can be used as deflecting region, which increases the quality of the examination considerably, because the particles moving along the axis carry an important part of the information about the specimen.

Furthermore, since there is now no limitation on the size of the detector, all kinds of detectors and spectrometers can be used to analyse the specimen. In addition to that, one type of detector can be easily replaced by another type of detector, in order to adapt the device to specific measurement needs.

According to a preferred embodiment, the particle mirror comprises a deflecting region located on the front surface for deflecting all particles in a given velocity range (energy range) and in a given angular range, so that the angle $\beta_o$ between the outgoing path of the particle and the axes normal to the front surface of the mirror, at the point where the particle hits the mirror, equals the angle $\alpha\beta_i$ between the incoming path of the particle and the axes normal to the front surface of the mirror. Due to the fact that the energy and the angular distribution of the particles coming from the specimen is preserved by the mirror, the detector is capable of basically recording the same information as if it were directly located near the specimen.

According to a preferred embodiment, the drift region of the particle mirror reaching from the back surface to the front surface is positioned away from the center of the mirror. The particle mirror is preferably arranged in such a manner, that most of the particles coming from the specimen are deflected towards the detector. This implies that the geometric center of the mirror is preferably located where the particles coming from the specimen are concentrated.

According to a preferred embodiment, the charged particle device further comprises a deflection unit for directing the charged particle beam essentially along the optical axis of the objective lens, said deflection unit being arranged between the particle mirror and the objective lens. In this arrangement basically all particles coming from the specimen and moving along the optical axis can be deflected to the detector. Obviously, the deflecting unit affects the charged particle beam moving towards the specimen as well as the charged particles coming from the specimen. However, these two types of particles are affected in different manner, which leads to a separation of the two types of particles. This is regardless of the deflection unit being magnetic or electrostatic.

A magnetic deflection unit, in particular, separates charged particle beam moving towards the specimen and the charged particles coming from the specimen into complementary parts. According to Lorentz Law, charged particles coming from the specimen which fly in a direction opposite to the direction of the charged particle beam experience an opposite force. In other words, they are directed into a region which is complementary to the region of the primary particle beam.

In case the deflection unit is electrostatic, the charged particles coming from the specimen are directed into the region as the primary particle beam. However, the angle of redirection of the charged particles coming from the specimen is bigger since the angle of redirection is inversely proportional to the velocity. This results in a directional separation of the secondary particles from the primary particles. Since a magnetic deflection unit deflects charged particle beam moving towards the specimen and the charged particles coming from the specimen into opposite directions, it is preferred to use a magnetic deflection unit.

According to a still further preferred embodiment, the charged particle device further comprises a three step deflection unit for deflecting the charged particle beam away form the optical axis and back onto the optical axis. By using a three step deflection unit the particle source, and any other element used to shape the beam of charged particles, can be arranged along the axis of the objective lens, which leads to compact design of the complete device. The three step deflection unit may consist of elements, like magnetic coils, which are used only for this purpose. However, the three step deflection unit may also consist of elements, which, for example, are additionally used to move the charged particle beam across the specimen (scanning unit).

According to a still further preferred embodiment, the particle mirror is tilted with regard to the optical axis by an angel $\alpha$ between about 20 and about 70 degree, preferably about 40 and about 50 degree, most preferably about 45 degree. By this orientation of the particle mirror, the particles coming from the specimen are easily directed to the periphery of the device, where all kinds of detectors can be arranged without affecting the rest of the device. By using a 45 degree orientation of the particle mirror, it can be assured that the time difference of two different particles moving to the detector is minimal, as long as there are of the same initial velocity.

According to a still further preferred embodiment, the particle mirror comprises a conductive surface or a conductive deflecting grid kept on a predetermined potential sufficient to deflect all particles having less than a predetermined energy. Thereby, the surface of a metal plate can be used as a conductive surface. Furthermore, a ceramic material, for example $Al_2O_3$, having a conductive coating can be used for this purpose. In this arrangement the particle mirror acts like a low pass filter and by varying the potential of the conductive surface or the conductive deflecting grid, the mirror can be used for spectroscopic purposes. Furthermore, it is preferred if the particle mirror comprises at least one conductive screening grid for screening potential of the surface or the conductive deflecting grid from the rest of the device and/or a particle absorber for absorbing particles having more than the predetermined energy. In case a metal plate or a ceramic plate having a conductive coating is used, the metallic or ceramic plate can be used as the particle absorber.

According to a still further preferred embodiment, a second detector is arranged behind the conductive deflecting grid for detecting particles having more than the predetermined energy.

According to a still further preferred embodiment, the charged particle device further comprises a high pass filter, which is arranged in front of the detector, allowing only particles having an energy above a predetermined energy to enter the detector. The combination of a low pass filter and a high pass filter allows to pick out any band of energies for the detection and thus enhance material contrast or other features of the specimen. Thereby, it is preferred that the high pass filter comprises a conductive filtering grid kept on a predetermined potential sufficient to filter out all particles having less than a predetermined energy.

According to a still further preferred embodiment, said drift region is positioned away from the optical axis of the objective lens, so that all charged particle coming from the specimen within an angle $\gamma \leq 5$ degree, preferably $\leq 10$ degree, as measured from the optical axis of the objective lens, hit the deflecting region of the mirror. This has the advantage that, especially for specimen with a high topography, most of the charged particles coming from the specimen can be detected.

According to the second aspect of the present invention, there is provided a particle mirror for use in a charged particle device comprising: a front surface and a back surface, a deflecting region located on the front surface for deflecting all particles in a given velocity range and in a given angular range, a drift region reaching from the back surface to the front surface for letting particles pass from the back surface to the front surface of the mirror, the drift region being positioned away from the geometrical center of the mirror.

According to a preferred embodiment, the particle mirror further comprises a conductive surface or the conductive deflecting grid kept on a predetermined potential sufficient to deflect all particles having less than a predetermined energy. Furthermore, it is preferred if the particle mirror comprises a conductive screening grid for screening potential of the surface or the conductive deflecting grid from the rest of the device and/or a particle absorber for absorbing particles having more than the predetermined energy.

According to the third aspect of the present invention, there is provided a charged particle device comprising: a particle source for providing a charged particle beam; an objective lens for focusing the particle beam onto a specimen; a particle mirror for deflecting charged particles coming from the specimen towards a detector, and a high pass filter being arranged in front of the detector, allowing only particles having an energy above a predetermined energy to enter the detector.

BRIEF DESCRIPTION OF THE DRAWINGS

Some of the above indicated and other more detailed aspects of the invention will be described in the following description and partially illustrated with reference to the figures. Therein.

DESCRIPTION OF THE PREFERRED EMBODIMENTS

Figure 1:
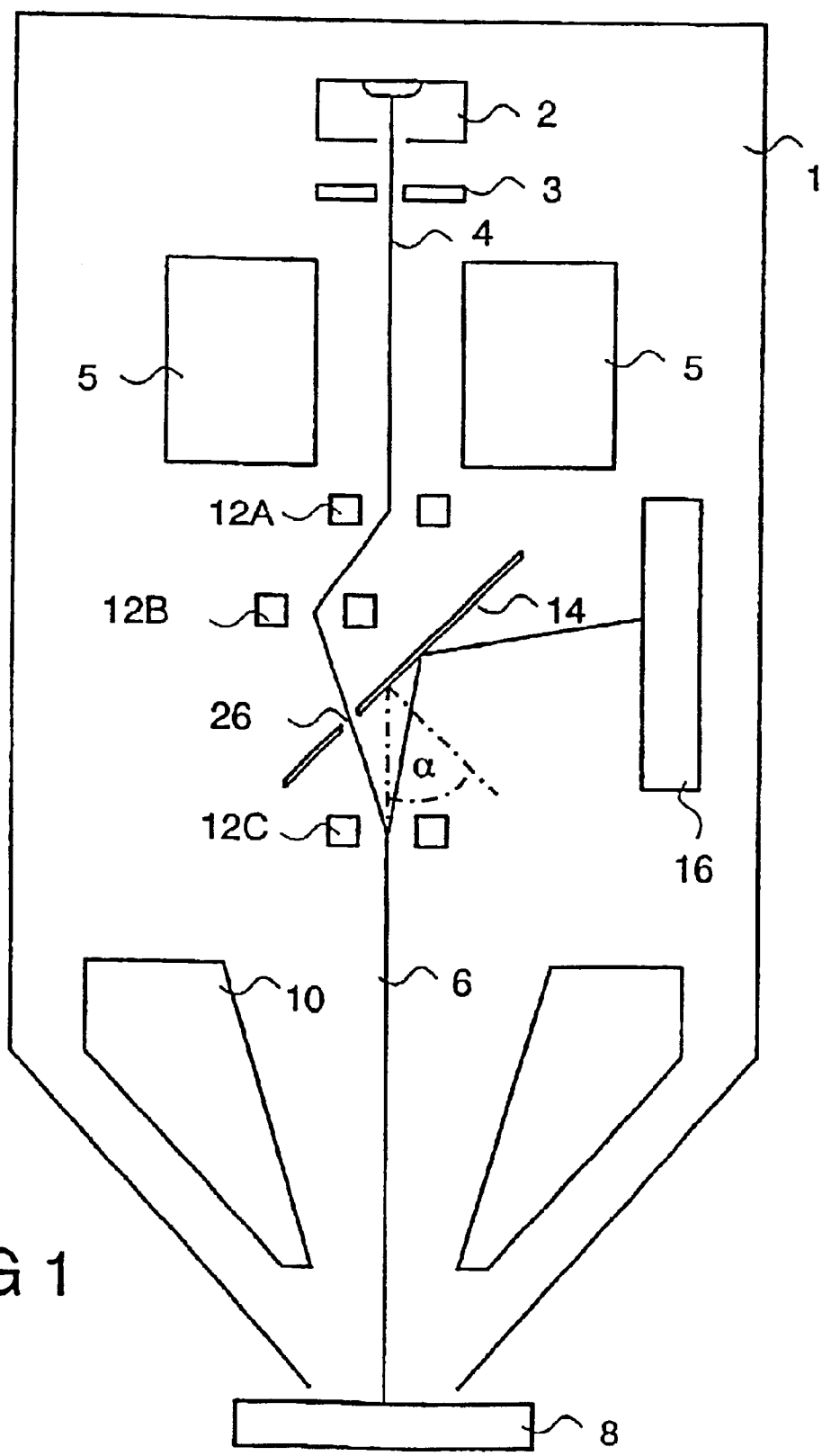
FIG. 1 is a schematic vertical cross section of a charged particle device according to a first embodiment of the present invention.

A first embodiment according to the invention is shown schematically in FIG. 1. A charged particle beam 4, normally an electron beam, comes from charged particle source 2 e.g. a tungsten-hairpin gun, a lanthanum-hexaboride gun, a field-emission gun, or a thermionic Schottkey emitter. At least one anode 3 is arranged below the particle source 2, which attracts and accelerates the charged particles. In order to accelerate the charged particles, the charged particle source 2 is kept on negative potential, for example –0.5 kV, whereas the anode 3 is kept on a positive potential, for example +10 kV.

Figure 2:
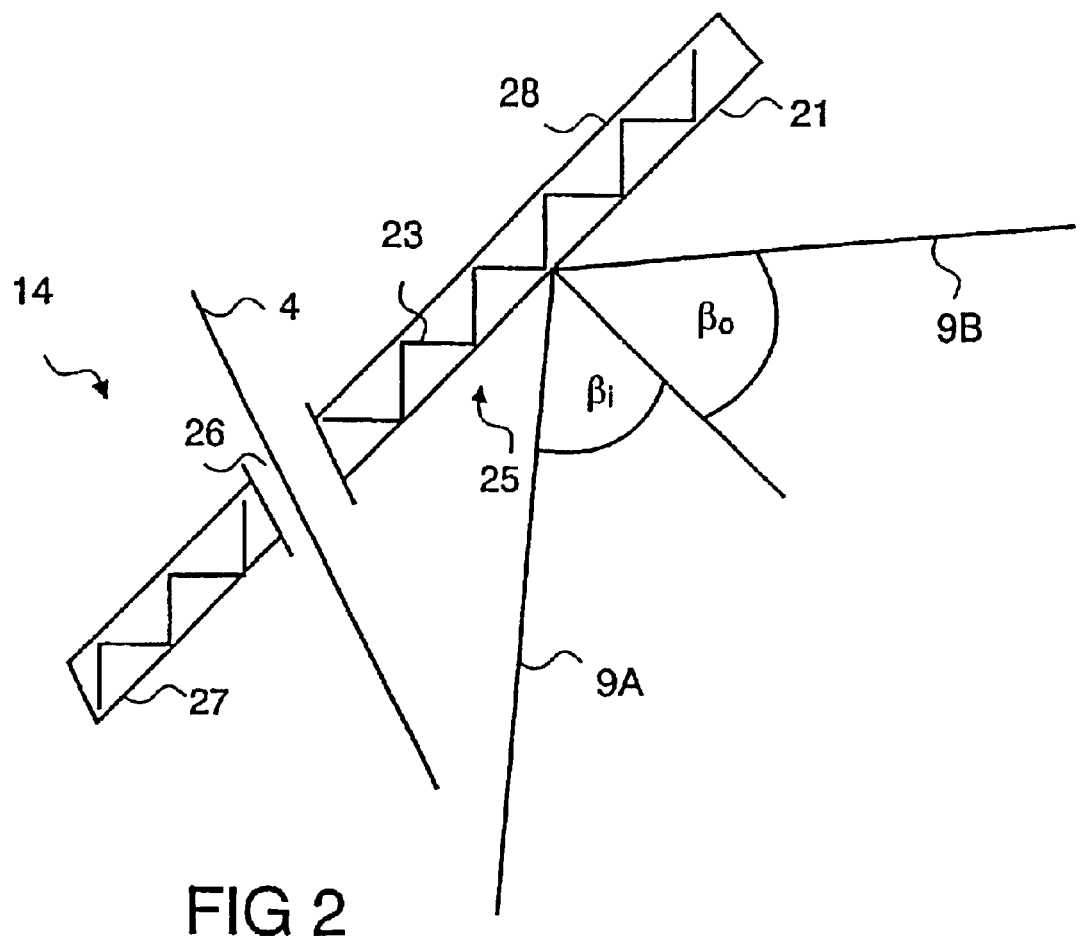
FIG. 2 is a enlarged view of the particle mirror as used in FIG. 1.

The anode 3 is followed by a condenser lens 5, which concentrates the charged particles into a fine beam and guides the beam along the optical axis 6, which is also the axis of the objective lens 10. The first stage 12A of the three step deflection unit 12 deflects the beam 4 of charged particles away from the optical axis 6. The beam 4 of charged particles then enters the second stage 12B of the three step deflection unit, which redirects the beam 4 of charged particles towards the optical axis 6. On its way back to the optical axis 6, the beam 4 passes the particle mirror 14, that is located on the optical axis 6. The charged particle beam 4 passes the particle mirror 14 through a drift region 26 (drift tube) arranged within the particle mirror 14. The drift region 26 reaches from the back surface 28 of the mirror to the front surface 27 of the mirror (see FIG. 2). Due to drift region 26 arranged in the particle mirror 14, the charged particle beam 4 passes the particle mirror 14 in a basically undisturbed manner. Accordingly, there is no need for any additional measures for correcting the charged particle beam.

The beam 4 of charged particles then enters the third stage 12C of the three step deflection unit 12, which redirects the beam 4 of charged particles essentially in the direction the optical axis 6. The deflection unit 12 may comprise electrostatic or magnetic deflection stages 12A–12C.

The third stage 12C of the three step deflection unit 12 is followed by the objective lens 10 for focusing the particle beam 4 onto a specimen 8. In order to decelerate the charged particles, the specimen 8 is grounded, so that the charged particles, normally electrons, hit the specimen 8 with an energy of 0.5 keV in this example.

When the charged particles strike the surface of the specimen 8, they undergo a series complex interactions with the nuclei and electrons of the atoms of the specimen. The interactions between the incident charged particles and the atoms of the specimen may be elastic or inelastic. The interactions produce a variety of secondary products, such as electrons of different energy, X rays, light, and heat, as well as charged particles scattered backward. Many of these secondary products and/or the backscattered charged particles are used to produce the image of the specimen and to collect additional data from the specimen.

A secondary product of major importance to examination or the image formation of specimens are secondary electrons that escape from the specimen at a variety of angles with relatively low energy (3 to 50 eV). Due to the high positive potential inside the objective lens 10 (in this example +10 kV), the secondary electrons are drawn into the objective lens 10 and are accelerated towards the particle mirror 14. The secondary electrons pass the third stage 12C of the three step deflection unit 12 and move on to the particle mirror 14. By passing the third stage 12C of the three step deflection unit 12, the secondary electrons are also deflected. In the example shown in FIG. 1 the third stage 12C of the three step deflection unit 12 is a magnetic deflection unit. Therefore, the secondary electrons are deflected in the opposite direction with regard to the primary electron beam 4. Accordingly, the primary electron beam and the secondary electrons are separated without negatively affecting the primary electron beam 4.

The secondary electrons hit the deflecting region 25 of the particle mirror 14 and are deflected toward the detector 16. In the embodiment of the present invention shown in FIG. 1, the particle mirror 14 comprises a conductive surface 21, which is tilted with regard to the optical axis 6 by an angel α of about 45 degree. Furthermore, the conductive surface 21 is kept on a predetermined potential sufficient to deflect all particles having less than a predetermined energy. In this example, the conductive surface 21 is kept on a potential of slightly below +5 kV, in order to deflect all secondary electrons coming from the specimen 8 towards the detector 16. Thereby, the secondary electrons are deflected in a manner, so that the angle $\beta_o$ between the outgoing path of the particle and the axes normal to the front surface of the mirror equals the angle $\beta_i$ between the incoming path of the particle and the axes normal to the front surface of the mirror (see FIG. 2).

In this example, the particle mirror is made of $Al_2O_3$ having a conductive coating on the front and on the back surface thereof, whereby the conductive coating on the front surface is isolated from the conductive coating on the back surface. Furthermore, the particle mirror 14 comprises a metal tube located in the mirror, which forms the drift region 26. The metal tube is connected with the back surface of the mirror and is kept on the same potential as the back surface of the mirror. Care has to be taken at the periphery of mirror and between the drift region 26 and the deflecting region 25, in order to avoid any shorts between the front and the back surface of the mirror.

The detector 16 may be chosen from a variety of detector types. In the present example, the detector 16 is a scintillator that is connected to a photo multiplier via a light guide. The output of the detector 16 is then used, for example, to display or to record an image of the surface of the specimen.

Backscattered particles, normally electrons, are also of importance to the image formation of specimens. Backscattered electrons are high in energy, with an average of 60% to 80% of the initial energy of the electron beam (0.5 keV in this example). Due to the high positive potential inside the objective lens 10 (in this example +10 kV), the backscattered electrons are also drawn into the objective lens 10 and are accelerated towards the particle mirror 14. The backscattered electrons pass the third stage 12C of the three step deflection unit 12 and move on to the particle mirror 14. By passing the third stage 12C of the three step deflection unit 12, the backscattered electrons are also deflected. As explained above, the third stage 12C of the three step deflection unit 12 is a magnetic deflection unit. Therefore, the backscattered electrons are also deflected in the opposite direction with regard to the primary electron beam 4. Accordingly, the primary electron beam and the backscattered electrons are separated without negatively affecting the primary electron beam 4.

Accordingly, the backscattered electrons also hit the deflecting region 25 of the particle mirror 14. However, due to their relatively high energy compared to the secondary electrons, the potential of the conductive surface 21 is not sufficient to deflect the backscattered electrons. Accordingly, the backscattered electrons pass through the conductive surface 21 and reach the ceramic material $Al_2O_3$ which acts as a particle absorber 23.

In order to separate the secondary electrons from the backscattered electrons, in the general case the potential of the conductive surface 21 is to be chosen slightly below BE $\sin^2\alpha$, whereby BE is the potential inside the objective lens 10 and the angle α is the angle between the optical axis and an axis normal to the front surface of the particle mirror 14. By scanning the charged particle beam over the specimen and displaying/recording the output of the detector 16 an image of the surface of the specimen is formed.

Figure 3:
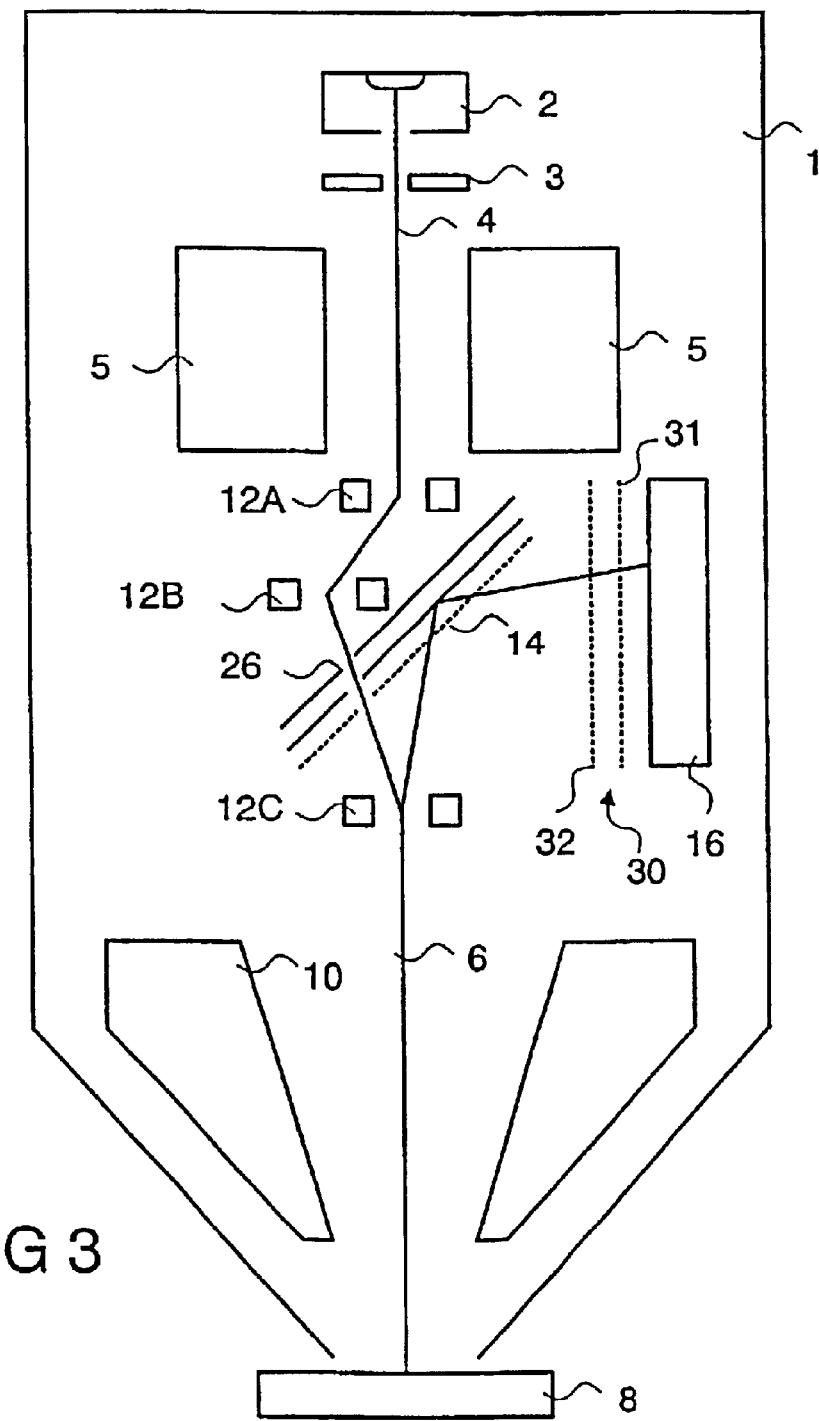
FIG. 3 is a schematic vertical cross section of a charged particle device according to a second embodiment of the present invention.

A second embodiment according to the invention is shown schematically in FIG. 3. Components that are the same as in FIG. 1 have the same reference designators and are not described further. The embodiment shown in FIG. 3 differs from the embodiment shown in FIG. 1 in that an additional conductive screening grid 22, for screening potential of the conductive surface 21 from the rest of the device, is provided in front of the conductive surface 21. Furthermore, the embodiment according to the invention shown in FIG. 3 comprises a high pass filter 30 that is arranged in front of the detector 16, allowing only particles having an energy above a predetermined energy to enter the detector 16. The high pass filter 30 comprises a conductive filtering grid 31 and a further screening grid 32 arranged before the filtering grid 31. The combination of the low pass filter 14 (the particle mirror) and the high pass filter 30 allows to pick out any band of energies for the detection and thus enhance material contrast or other features of the specimen.

Figure 4:
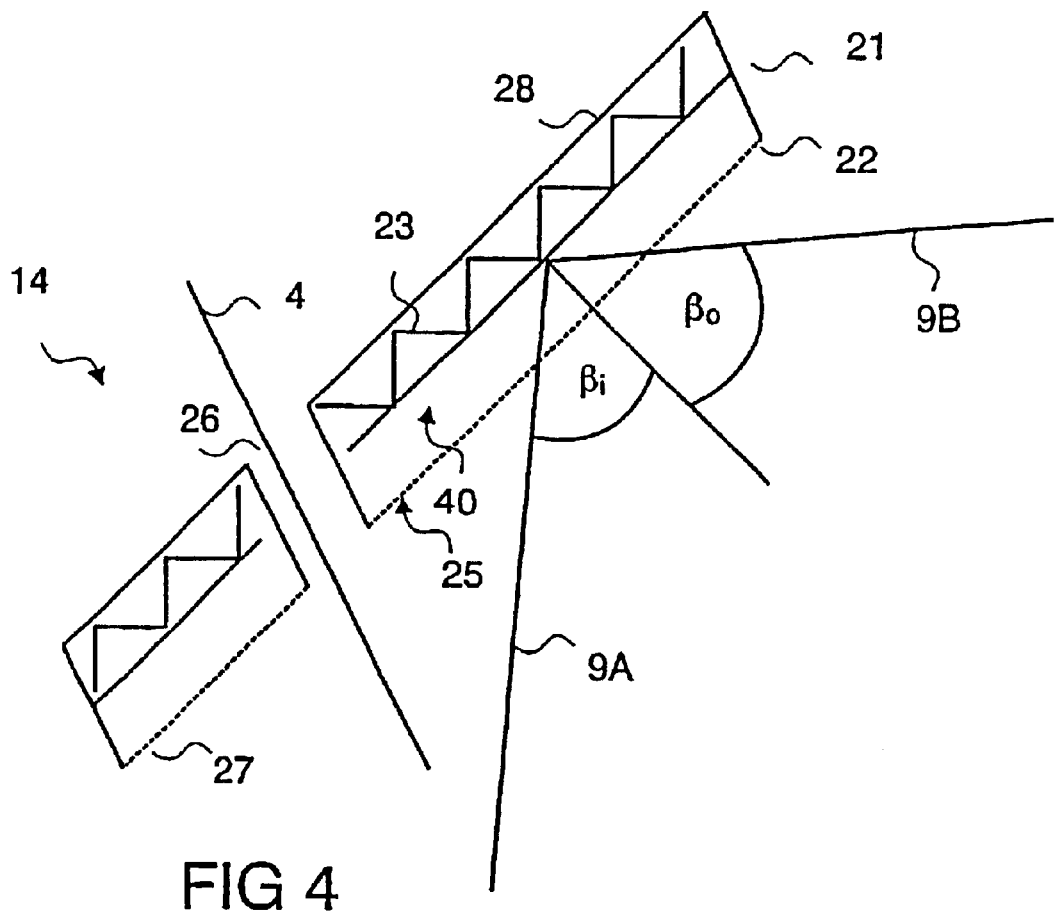
FIG. 4 is a enlarged view of the particle mirror as used in FIG. 3.

FIG. 4 is a enlarged view of the particle mirror 14 as used in FIG. 3. The particle mirror 14 as shown in FIG. 3 comprises a front surface 27, a back surface 28, a deflecting region 25 located on the front surface for deflecting all particles in a given velocity range (energy range) and in a given angular range, and a drift region 26 reaching from the back surface 28 to the front surface 27 for passing particles from the back surface 28 to the front surface 27 of the mirror.

Furthermore, particle mirror 14 comprises a conductive surface 21 kept on a predetermined potential sufficient to deflect all particles having less than a predetermined energy. The potential of surface 21 is screened by a conductive screening grid 22 located in front of the surface 21. Thereby, the distance between the conductive surface 21 and the screening grid 22 is preferably chosen larger than 10 times the mesh size of the grid 22. The screening grid 22 is preferably maintained on the same potential as those elements adjacent to the particle mirror 14 in the charged particle device. By using a screening grid 22 the potential of the conductive surface 21, which is usually considerably different from the potential of elements adjacent to the particle mirror 14, can be hidden from these elements. Accordingly, negative side effects due to the potential of the conductive surface 21 can be avoided.

When a charged particle, like a secondary electron, having less than a predetermined energy hits the deflecting region 25 of the particle mirror 14, the particle is deflected in a manner, so that the angle $\beta_o$ between the outgoing path 9B of the particle and the axes normal to the front surface of the mirror equals the angle $\beta_i$ between the incoming path 9A of the particle and the axes normal to the front surface of the mirror.

Since the particle mirror 14 is made of a ceramic material, the ceramic material functions as a particle absorber 23 located between the back surface 28 of the mirror and the conductive surface 21 for absorbing particles, which have more than the predetermined energy and which are, therefore, able to pass through the surface 21.

As can be seen from FIG. 4, the drift region is not located at the geometrical center of the mirror, which is indicated with the reference number 40. The mirror shown in FIG. 4 has the shape of a circular disk having a middle point. Accordingly, the geometrical center of the mirror is the middle point of the disk. Due to the fact that the drift region is positioned away from the geometrical center of the mirror, the geometrical center of the mirror can be used as deflecting region, which increases the quality of the examination considerably.

Figure 5:
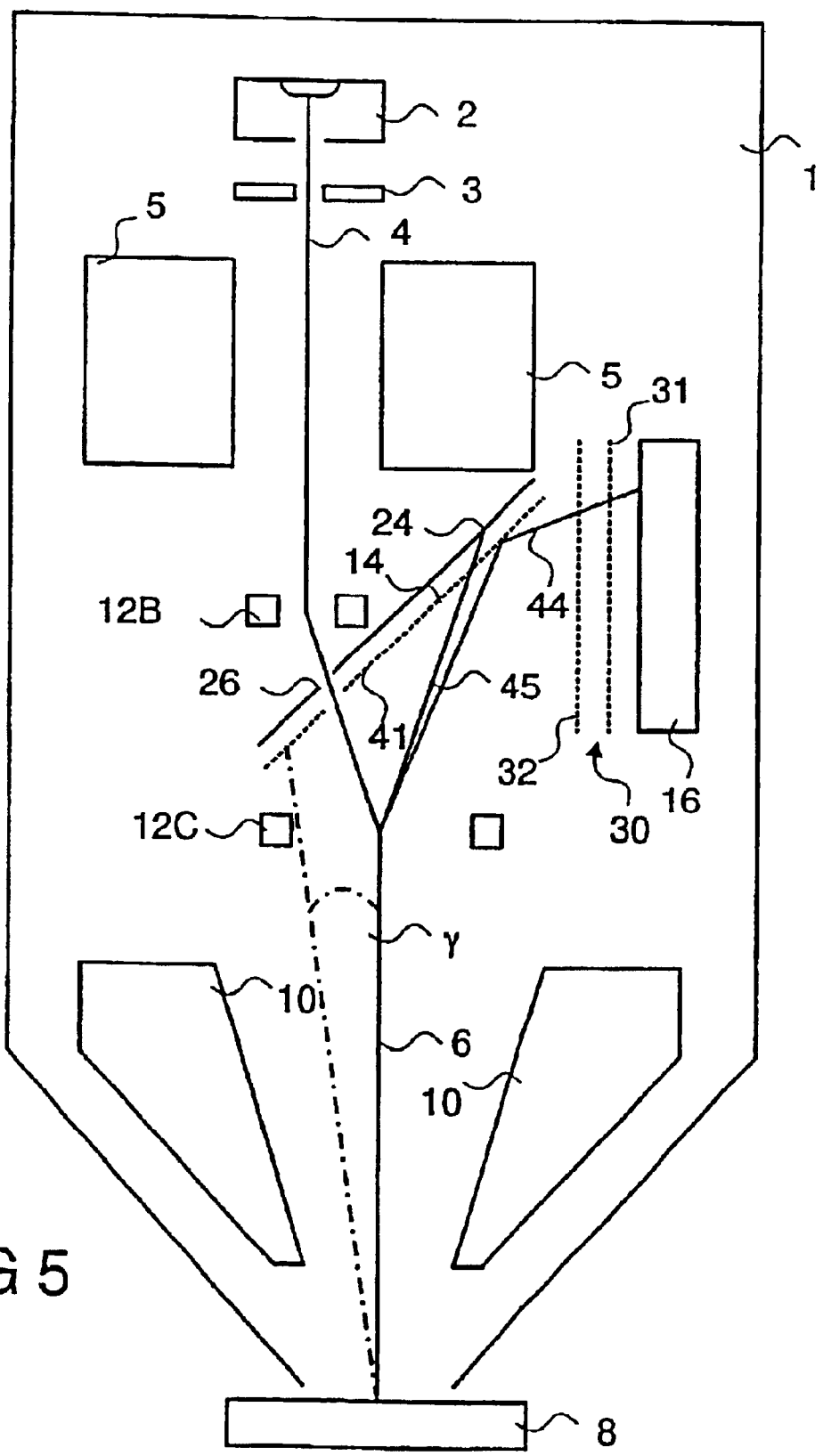
FIG. 5 is a schematic vertical cross section of a charged particle device according to a third embodiment of the present invention.

A third embodiment according to the invention is shown schematically in FIG. 5. A charged particle beam 4, normally an electron beam, comes from charged particle source 2 e.g. a tungsten-hairpin gun, a lanthanum-hexaboride gun, a field-emission gun, or a thermionic Schottkey emitter. At least one anode 3 is arranged below the particle source 2, which attracts and accelerates the charged particles. In order to accelerate the charged particles, the charged particle source 2 is kept on negative potential, for example −0.5 kV, whereas the anode 3 is kept on a positive potential, for example +10 kV.

The anode 3 is followed by a condenser lens 5, which concentrates the charged particles into a fine beam and guides the beam along the optical axis 6', which is not the axis 6 of the objective lens 10. The beam 4 of charged particles then enters the first stage 12B of a two step deflection unit, which directs the beam 4 of charged particles towards the optical axis 6 of the objective lens. On its way to the optical axis 6, the beam 4 passes the particle mirror 14, that is located on the optical axis 6 of the objective lens. The charged particle beam 4 passes the particle mirror 14 through a drift region 26 (drift tube) arranged in the particle mirror 14. Due to drift region 26 arranged in the particle mirror 14, the charged particle beam 4 passes the particle mirror 14 in a basically undisturbed manner. Accordingly, there is no need for any additional measures for correcting the charged particle beam. The beam 4 of charged particles then enters the second stage 12C of the two step deflection unit 12, which redirects the beam 4 of charged particles in the direction the optical axis 6.

The deflection unit 12C is followed by the objective lens 10 for focusing the particle beam 4 onto a specimen 8. In order to decelerate the charged particles, the specimen 8 is grounded, so that the charged particles, normally electrons, hit the specimen 8 with an energy of 0.5 keV in this example.

Due to the high positive potential inside the objective lens 10 (in this example +10 kV), the secondary electrons 44, that escape from the specimen 8, are drawn into the objective lens 10 and are accelerated towards the particle mirror 14. The secondary electrons 44 pass the deflection unit 12C and move on to the particle mirror 14. By passing the deflection unit 12C, the secondary electrons are also deflected. In the example shown in FIG. 5 the deflection unit 12C is a magnetic deflection unit. Therefore, the secondary electrons 44 are deflected in the opposite direction with regard to the primary electron beam 4. Accordingly, the primary electron beam and the secondary electrons are separated without negatively affecting the primary electron beam 4.

The secondary electrons 44 hit the deflecting region 25 of the particle mirror 14 and are deflected toward the detector 16. In the embodiment of the present invention shown in FIG. 5, the particle mirror 14 comprises a conductive deflecting grid 41, which is tilted with regard to the optical axis 6 by an angel α of about 45 degree. Furthermore, the conductive deflecting grid 41 is kept on a predetermined potential sufficient to deflect all particles having less than a predetermined energy. In this example, the deflecting grid 41 is kept on a potential of slightly below +5 kV, in order to deflect all secondary electrons coming from the specimen 8 towards the detector 16. Thereby, the secondary electrons 44 are deflected in a manner, so that the angle $\beta_o$ between the outgoing path of the particle and the axes normal to the front surface of the mirror equals the angle $\beta_i$ between the incoming path of the particle and the axes normal to the front surface of the mirror.

Due to the high positive potential inside the objective lens 10 (in this example +10 kV), the backscattered electrons 45 are also drawn into the objective lens 10 and are accelerated towards the particle mirror 14. Accordingly, the backscattered electrons 45 also hit the deflecting region 25 of the particle mirror 14. However, due to their relatively high energy compared to the secondary electrons 44, the potential of the conductive deflecting grid 41 is not sufficient to deflect the backscattered electrons 45. Accordingly, the backscattered electrons pass through the conductive deflecting grid 41 and reach the second detector 24 that is arranged behind the conductive deflecting grid 41. The second detector 24 may also be chosen from a variety of detector types. In the present example, the second detector 24 is also a scintillator that is connected to a photo multiplier via a light guide. In case the information that is connected with the backscattered particles is not needed, the second detector 24 may also be replaced by a particle absorber, which absorbs the backscattered particles 45. The particle absorber may for example be formed by a dielectric material.

As can be seen from FIG. 5, the drift region 26 of the mirror 14 is positioned away from the optical axis 6 of the objective lens 10, so that all charged particle coming from the specimen 8 within an angle $\gamma \leq 10$ degree, as measured from the optical axis of the objective lens, hit the deflecting region of the mirror 14. This has the advantage that, especially for specimen with a high topography, most of the electrons coming from the specimen can be detected.

By scanning the charged particle beam over the specimen and displaying/recording the output of the detector 16 and/or displaying/recording the output of the second detector 24 an image of the surface of the specimen is formed.

Figure 6:
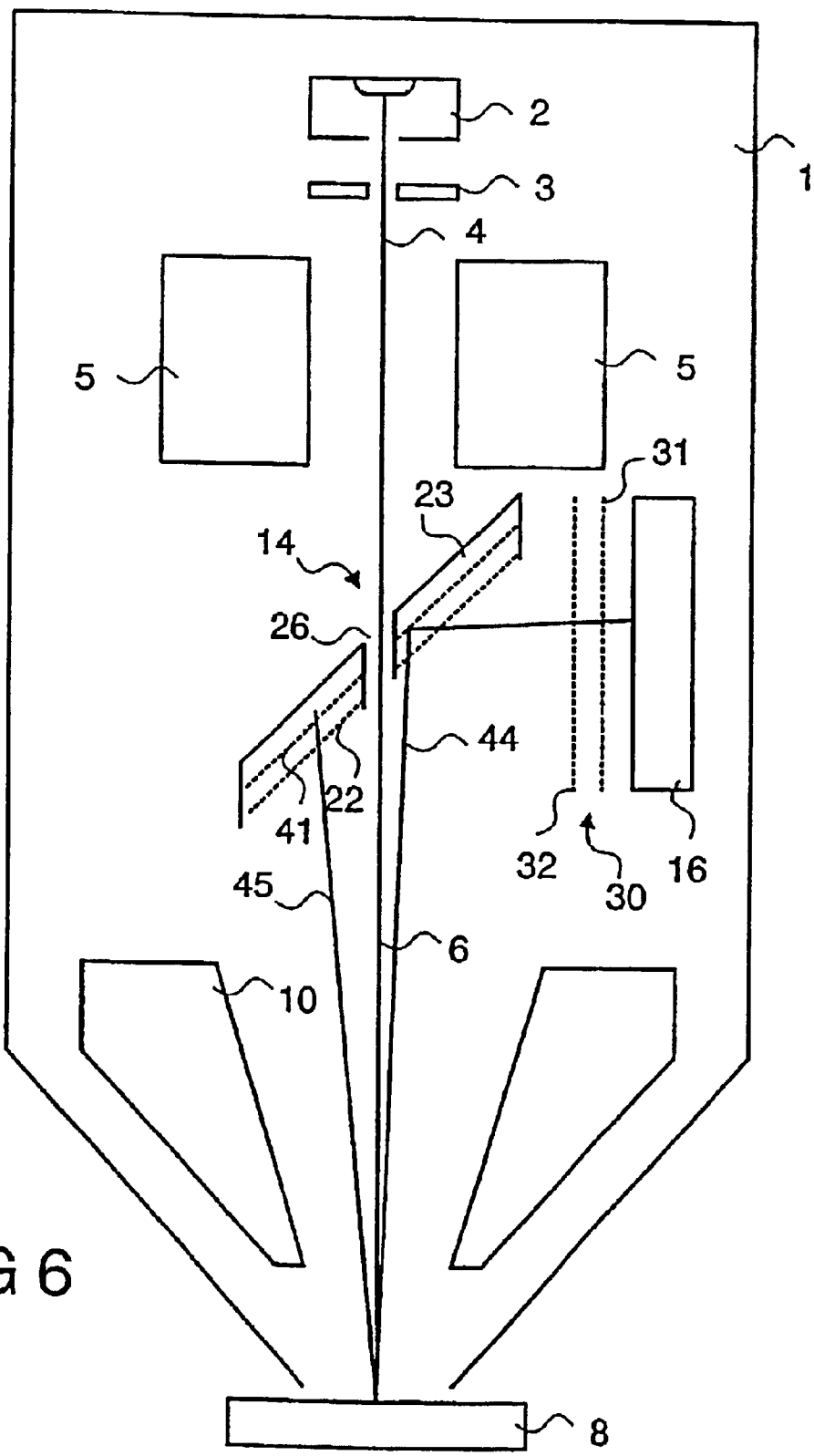
FIG. 6 is a schematic vertical cross section of a charged particle device according to a fourth embodiment of the present invention.

A fourth embodiment according to the invention is shown schematically in FIG. 6. A charged particle beam 4, normally an electron beam, comes from charged particle source 2 e.g. a tungsten-hairpin gun, a lanthanum-hexaboride gun, a field-emission gun, or a thermionic Schottkey emitter. At least one anode 3 is arranged below the particle source 2, which attracts and accelerates the charged particles. In order to accelerate the charged particles, the charged particle source 2 is kept on negative potential, for example −0.5 kV, whereas the anode 3 is kept on a positive potential, for example +10 kV.

The anode 3 is followed by a condenser lens 5, which concentrates the charged particles into a fine beam and guides the beam along the optical axis 6. On its way along the optical axis 6, the beam 4 passes the particle mirror 14, that is located on the optical axis 6 of the objective lens 10. The charged particle beam 4 passes the particle mirror 14 through a drift region 26 (drift tube) arranged in the center of the particle mirror 14. Due to drift region 26 arranged in the particle mirror 14, the charged particle beam 4 passes the particle mirror 14 in a basically undisturbed manner.

The particle mirror 14 is followed by the objective lens 10 for focusing the particle beam 4 onto a specimen 8. In order to decelerate the charged particles, the specimen 8 is grounded, so that the charged particles, normally electrons, hit the specimen 8 with an energy of 0.5 keV in this example.

Due to the high positive potential inside the objective lens 10 (in this example +10 kV), the secondary electrons, that escape from the specimen 8, are drawn into the objective lens 10 and are accelerated towards the particle mirror 14. The secondary electrons 44 hit the deflecting region 25 of the particle mirror 14 and are deflected toward the detector 16. In the embodiment of the present invention shown in FIG. 6 the particle mirror 14 comprises a conductive deflecting grid 41, which is tilted with regard to the optical axis 6 by an angel α of about 45 degree. Furthermore, the conductive deflecting grid 41 is kept on a predetermined potential sufficient to deflect all particles having less than a predetermined energy. In this example, the deflecting grid 41 is kept on a potential of slightly below +5 kV, in order to deflect all secondary electrons coming from the specimen 8 towards the detector 16. Thereby, the secondary electrons 44 are deflected in a manner, so that the angle $\beta_o$ between the outgoing path of the particle and the axes normal to the front surface of the mirror equals the angle $\beta_i$ between the incoming path of the particle and the axes normal to the front surface of the mirror.

On their way to the detector 16, the secondary electrons 44 pass a high pass filter 30 that is arranged in front of the detector 16, allowing only particles having an energy above a predetermined energy to enter the detector 16. The high pass filter 30 comprises a conductive filtering grid 31 and a further screening grid 32 arranged before the filtering grid 31. The combination of the low pass filter 14 (the particle mirror) and the high pass filter 30 allows to pick out any band of energies for the detection and thus enhance material contrast or other features of the specimen.

Due to the high positive potential inside the objective lens 10 (in this example +10 kV), the backscattered electrons 45 are also drawn into the objective lens 10 and are accelerated towards the particle mirror 14. Accordingly, the backscattered electrons 45 also hit the deflecting region 25 of the particle mirror 14. However, due to their relatively high energy compared to the secondary electrons, the potential of the conductive deflecting grid 41 is not sufficient to deflect the backscattered electrons. Accordingly, the backscattered electrons 45 pass through the conductive deflecting grid 41 and reach the particle absorber 23 that is arranged behind the conductive deflecting grid 41.

By scanning the charged particle beam over the specimen and displaying/recording the output of the detector 16 an image of the surface of the specimen is formed.

While the invention has been described with reference to various exemplary embodiments thereof, those of ordinary skill in the art would appreciate that various implementations and variations are possible without departing from the scope and spirit of the invention, as defined by the appended claims. For example, it should be readily apparent that the particle mirror can be tilted at angles other than 45 degrees, depending on the particular construction of the particle column. Similarly, the various voltage values are provided as examples only, and other values may be used. Also, the filtering schemes on the mirror and detector may be implemented to various degrees and combinations, and can be readily applied in any such combinations to any of the exemplary embodiments disclosed herein.

What is claimed is:

1. A charged particle device (1) comprising:
   a particle source (2) for providing a charged particle beam (4);
   an objective lens (10) for focusing the particle beam onto a specimen (8), said objective lens (10) having an optical axis (6);
   a particle mirror (14) located on the optical axis (6) of the objective lens (10), said particle mirror (14) having a front surface (27), a back surface (28), a drift region (26) reaching from the back surface (28) to the front surface (27) for letting the charged particle beam (4) pass from the back surface (28) to the front surface (27), said drift region (26) being positioned away from the optical axis (6), and a deflecting region (25) located on the front surface (27) for deflecting charged particles coming from the specimen (8) toward a detector (16).

2. The charged particle device (1) according to claim 1 wherein the particle mirror (14) comprises a deflecting region (25) located on the front surface (27) for deflecting all particles in a given velocity range and in a given angular range, so that the angle $\beta_o$ between the outgoing path of the particle and the axes normal to the front surface of the mirror, at the point where the particle hits the mirror, equals the angle $\beta_i$ between the incoming path of the particle and the axes normal to the front surface of the mirror.

3. The charged particle device (1) according to claim 1 wherein the drift region (26) reaching from the back surface (28) to the front surface (27) is positioned away from the geometrical center (40) of the mirror.

4. The charged particle device (1) according to claim 1 further comprising a deflection unit (12C) for directing the charged particle beam essentially along the optical axis of the objective lens, said deflection unit (12C) being arranged between the particle minor (14) and the objective lens (10).

5. The charged particle device (1) according to claim 4 comprising a three step deflection unit (12) for deflecting the charged particle beam (4) away form the optical axis (6) and essentially back onto the optical axis (6) of the objective lens (10).

6. The charged particle device (1) according to claim 1 wherein the particle mirror (14) is tilted with regard to the optical axis (6) by an angle α between about 20 and about 70 degrees, preferably between about 40 and about 50 degrees, most preferably about 45 degrees.

7. The charged particle device (1) according to claim 1 wherein the particle mirror (14) comprises a conductive surface (21) or a conductive deflecting grid (41) kept on a predetermined potential sufficient to deflect all particles having less than a predetermined energy.

8. The charged particle device (1) according to claim 7 wherein the particle mirror (14) comprises at least one conductive screening grid (22) for screening potential of the conductive surface (21) or the conductive deflecting grid (41) from the rest of the device.

9. The charged particle device (1) according to claim 7 wherein the particle minor (14) comprises a particle absorber (23) for absorbing particles having more than the predetermined energy.

10. The charged particle device (1) according to claim 7 wherein a second detector (24) is arranged behind the conductive deflecting grid (41) for detecting particles having more than the predetermined energy.

11. The charged particle device (1) according to claim 1 wherein a high pass filter (3) is arranged in front of the detector (16), allowing only particles having an energy above a predetermined energy to enter the detector.

12. The charged particle device (1) according to claim 11 wherein the high pass filter (30) comprises a conductive filtering grid (31) kept on a predetermined potential sufficient to filter out all particles having less than a predetermined energy.

13. The charged particle device (1) according to claim 1 wherein said drift region (26) is positioned away from the optical axis (6) of the objective lens (10), so that all charged particles coming from the specimen within an angle γ≦5 degrees, preferably ≦10 degrees as measured from the optical axis (6) of the objective lens (10), hit the deflecting region (25) of the mirror (14).

14. A particle mirror (14) for use in a charged particle device comprising:
  a front surface (27) and a back surface (28),
  a deflecting region (25) located on the front surface (27) for deflecting all particles in a given velocity range and in a given angular range,
  a drift region (26) reaching from the back surface (28) to the front surface (27) for letting particles pass from the back surface (28) to the front surface (27) of the mirror, the drift region (26) being positioned away from the geometrical center (40) of the mirror.

15. The particle minor (14) according to claim 14 wherein the particle mirror (14) further comprises a conductive surface (21) or a conductive deflecting grid (41) kept on a predetermined potential sufficient to deflect all particles having less than a predetermined energy.

16. The particle mirror (14) according to claim 15 wherein the particle mirror (14) further comprises at least one conductive screening grid (22) for screening potential of the conductive surface (21) or the conductive defecting grid (41).

17. The particle mirror (14) according to claim 15 wherein the particle mirror (14) further comprises a particle absorber (23) for absorbing particles having more than the predetermined energy.

18. The particle mirror (14) according to claim 14 wherein deflecting region (25) deflects the particles, so that the angle between the outgoing path of the particle and the axes normal to the front surface of the mirror, at the point where the particle hits the mirror, equals the angle between the incoming path of the particle and the axes normal to the front surface of the mirror.

19. A method for the examination of specimen with a beam of charged particles comprising the steps of:
  providing a charged particle beam;
  letting the charged particle beam pass through a drift region reaching from the back surface to the front surface of a particle mirror
  focusing the particle beam onto a specimen with an objective lens, said objective lens having an optical axis; and
  deflecting charged particles coming from the specimen towards a detector with a deflecting region of the particle mirror;
  wherein said drift region is positioned away from the optical axis.

* * * * *